United States Patent [19]
Liu et al.

[11] Patent Number: 5,151,381
[45] Date of Patent: Sep. 29, 1992

[54] METHOD FOR LOCAL OXIDATION OF SILICON EMPLOYING TWO OXIDATION STEPS

[75] Inventors: Yowjuang B. Liu, San Jose; Steven W. Longcor, Mountain View; Jih-Chang Lein, San Jose, all of Calif.

[73] Assignee: Advanced Micro Devices, Inc., Sunnyvale, Calif.

[21] Appl. No.: 437,023

[22] Filed: Nov. 15, 1989

[51] Int. Cl.⁵ ............................................. H01C 21/76
[52] U.S. Cl. ........................................ 437/69; 437/29; 437/70; 437/28
[58] Field of Search ....................... 437/28, 29, 41, 63, 437/69, 70; 148/DIG. 117

[56] References Cited

U.S. PATENT DOCUMENTS

| | | | |
|---|---|---|---|
| 4,551,910 | 11/1985 | Patterson | 437/69 |
| 4,971,923 | 11/1990 | Nakanishi | 437/69 |
| 4,987,093 | 1/1991 | Teng et al. | 437/69 |

OTHER PUBLICATIONS

Ghandi, S., *VLSI Fabrication Principles & Silicon and Gallium Arsenide*, John Wiley & Sons, New York ©1983 pp. 358–361, 385–391, 576–582, 620–622.
Wolf et al, *Silicon Processing For the VLSI Era*, vol. 1, Lattze Press, California ©1986 pp. 215–218, 228–231.
Wu, T., "The Influence of the LOCOS Processing Parameters on the Shape of the Bird's Beak Structure" J. Electrochem. Society: Solid State Science and Technology, Jul. 1983 pp. 1563–1565.
Kooi, E., et al., "Formation of Silicon Nitride at a Si-SiO₂ Interface During Local Oxidation of Silicon and During Heat-Treatment of Oxidized Silicon in NH₃ Gas," J. Electrochem. Soc.: Solid State Science and Technology, Jul. 1976, vol. 123, No. 7.
Appels, J. A., et al., "Local Oxidation of Silicon and its Application in Semiconductor-Device Technology," Philips Res. Repts. 25, 118–132, 1970.
Hui, J., et al., "Scaling Limitations of Submicron Local Oxidation Technology," IEEE, 1985.
Mizuno, T., et al., "Oxidation Rate Reduction in the Submicrometer LOCOS Process," IEEE Transactions on Electron Devices, vol. ED-34, No. 11, Nov. 1987.
Lewis, A. G., et al., "Device Isolation in High-Density LOCOS-Isolated CMOS," IEEE Transactions on Electron Devices, vol. ED-34, No. 6, Jun. 1987.
Tsai, H.-H., et al., "A Bird's Beak Reduction Technique for LOCOS in VLSI Fabrication," IEEE Electron Device Letters, vol. EDL-7, No. 2, Feb. 1986.
Deroux-Dauphin, P., et al., "Physical and Electrical Characterization of a SILO Isolation Structure," IEEE Transactions on Electron Devices, vol. ED-32, No. 11, Nov. 1985.
Sawada, S., et al., "Electrical Properties for MOS LSIs Fabricated Using Stacked Oxide SWAMI Technology," IEEE Transactions on Electron Devices, vol. ED-32, No. 11, Nov. 1985.
Han, Y.-P., et al., "Isolation Process using Polysilicon Buffer Layer for Scaled MOS/VLSI," Abstract No. 67, UTC/Mostek, 1984.

*Primary Examiner*—Olik Chaudhuri
*Assistant Examiner*—G. Fourson
*Attorney, Agent, or Firm*—Fliesler, Dubb, Meyer & Lovejoy

[57] ABSTRACT

A process of forming field oxide regions using a field oxidation performed in a dry oxidation environment in a temperature equal to or greater than approximately 1000° C. The dry oxidation reduces or eliminates the formation of Kooi ribbons, and the high temperature field oxidation allows the field oxide to flow, thereby reducing physical stresses normally associated with field oxidation performed at temperatures below 1000° C. The high temperature field oxidation also greatly reduces the ratio of the length of the bird's beaks formed during the field oxidation to the thickness of the field oxide, allowing smaller active regions to be formed. The thinner field oxide regions, in turn, make it possible to perform the field implant after the field oxidation, thereby avoiding the lateral encroachment problem and controlling source to drain or drain to source punch-through under the gate. Further, the high temperature field oxidation allows the well implant drive and the field oxidation to be performed simultaneously.

20 Claims, 6 Drawing Sheets

FIGURE 6
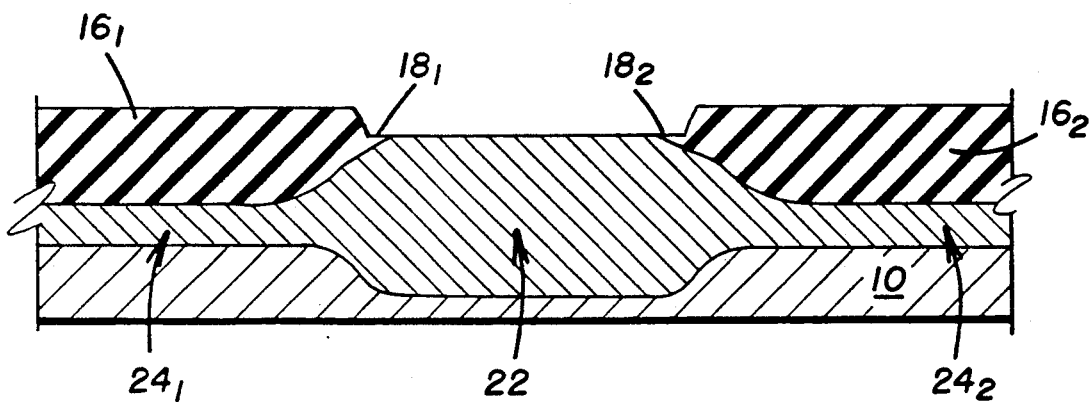
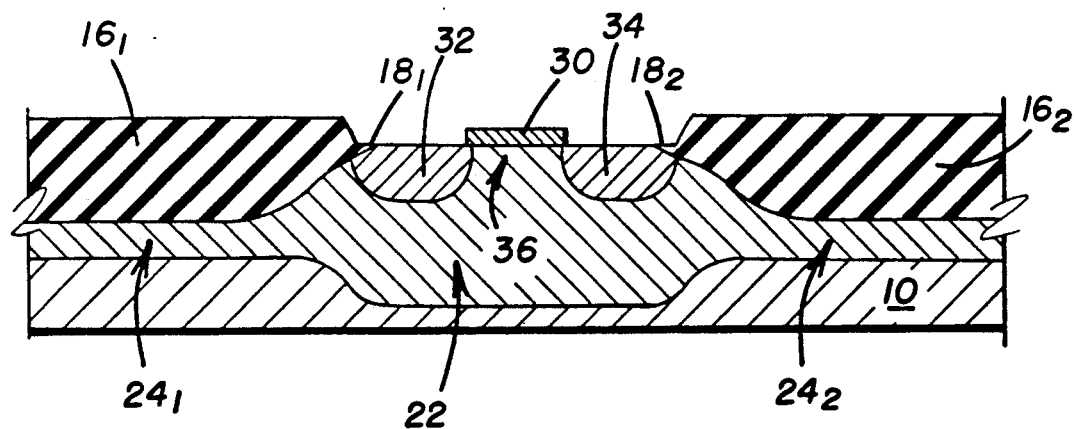
FIGURE 7

METHOD FOR LOCAL OXIDATION OF SILICON EMPLOYING TWO OXIDATION STEPS

BACKGROUND OF THE INVENTION

1. Field of the Invention

The present invention relates to a method for isolating active regions of a substrate through the formation of field oxide regions by local oxidation of silicon (LOCOS), and, more particularly, to a LOCOS process for high density semiconductor devices.

2. Description of the Related Art

The fabrication of semiconductor devices in a substrate requires electrical isolation of the regions of the substrate in which various individual circuit components are formed. The many isolation processes which have been proposed fall into two general groups, processes for forming field oxide (FOX) regions and processes for forming trench isolation regions. In general, processes for forming field oxide regions suffer from the creation of bird's beaks and processes for forming trench isolation regions suffer from the creation of stress induced defects in the substrate.

Bird's beaks, which are caused by lateral growth of oxide during the field oxidation process, serve as stress relief transition regions and help to prevent damage to the substrate caused by physical stresses. However, bird's beaks occupy a significant amount of circuit space, and make it difficult to reduce the size of the active regions defined by the field oxide. Stress may induce defects such as dislocation defects or stacking faults.

Several conventional isolation methods are discussed below.

Conventional LOCOS.

Conventional LOCOS methods involve providing a pad or barrier oxide layer on the surface of a substrate, forming a nitride layer overlying the pad or barrier oxide, and then patterning and etching the nitride layer. The portions of the substrate which are exposed by patterning and etching the nitride layer are then oxidized. The major problem with conventional LOCOS techniques is the formation of bird's beaks by lateral oxidation, i.e., the growth of an oxide under portions of the nitride layer. Lateral oxidation reduces the size of the active region, making it difficult to fabricate active regions having small dimensions using conventional LOCOS.

FIG. 1 illustrates a substrate 100 having field oxide 110 formed thereon. Field oxide 110 is intended to have regions 112 and 114 which are separated by an active region having a length $L_{AR}$. However, the formation of bird's beaks $118_1$ and $118_2$ reduce the effective length of the active region. In devices where $L_{AR}$ is large, the formation of bird's beaks can be tolerated. As $L_{AR}$ decreases, the length of the bird's beaks increases in relation to the length of the active region.

In conventional LOCOS processes it is important to select the proper thicknesses of the barrier oxide and nitride layers. Usually, these thicknesses are referred to as a ratio; the conventional thicknesses of the oxide and nitride layers are 200-500Å and 800-1600Å respectively, and the ratio of nitride thickness to oxide thickness is on the order of 2-8.

Bird's beaks, although undesirable from a space-spacing point of view, provide stress relief transition regions which aid in preventing damage to the substrate during field oxide formation. A higher thickness ratio improves the resultant structure of the field oxide regions by reducing bird's beak formation. However, because stress increases exponentially with increased nitride thickness it is difficult to increase the nitride thickness and/or the ratio of nitride thickness to oxide thickness is conventional LOCOS processes.

In addition, for conventional LOCOS processes, the length of the bird's beak is not linearly shrinkable with field oxide thickness because the ratio of bird's beak length to field oxide thickness increases as the field oxide thickness is reduced. Therefore, it is difficult to scale the bird's beak size in high density VLSI applications. Typically, the ratio $L_{bb}/T_{fox}$ in conventional LOCOS processes is approximately 0.8-1.2, or greater, for a field oxide thickness of 4,000Å-10,000Å, where $L_{bb}$ is the length of the bird's beak and $T_{fox}$ is the field oxide thickness. Another factor which limits conventional LOCOS processes is field oxide thinning effects; these effects are more pronounced when the length of the field oxide regions, i.e., the spacing of two adjacent active regions, is small. Field oxide thinning causes the electrical isolation provided by the field oxide to be less effective.

Trench Isolation

Trench isolation processes involve removing a portion of the substrate by etching to form a trench which surrounds an active region of the substrate and filling the trench with an electrically insulating material. Several problems are associated with isolation trenches. First, trenches tend to create a side wall leakage path, due, in part, to etch damage, which allows a leakage current to flow between the source and drain under the gate. Second, trenches produce stress-induced defects (e.g., cracks), particularly at the sharp corners created during the formation of the trench. Third, trench filling methods provide an insulator which is flush with the surface of the substrate, and thus oxide loss during cleaning etches results in a non-planar surface.

Sealed Interface LOCOS (SILO)

In sealed interface LOCOS (SILO), the pad or barrier oxide utilized with conventional LOCOS is eliminated and the entire surface of the substrate is thermally nitridized. A second layer of nitride is deposited on the thermal nitride, both the first and second nitride layers are patterned and etched, and the exposed portion of the substrate is then oxidized to form field oxide regions. The thermal (or first) nitride layer is used to prevent lateral oxidation. SILO technology is discussed in "Physical and Electrical Characterization of a SILO Isolation Structure," Deroux-Dauphin, et al., IEEE Transactions on Electron Devices, Vol. ED-32, No. 11, p. 2392, November, 1985.

Two of the problems associated with SILO are as follows: it is difficult to remove a nitride in contact with the substrate without damaging the substrate. Further, the SILO process causes stress-induced defects due to factors including the brittleness of the thermal nitride, and the different coefficients of thermal expansion of the thermal nitride and the silicon substrate. The stress-induced defects include dislocation defects and stacking faults.

Side Wall Mask Isolation (SWAMI)

Side wall mask isolation (SWAMI) combines trench isolation and LOCOS techniques. First, a trench is etched in the silicon substrate, then the surface of the substrate and the sidewalls of the trench are covered with a nitride layer. The nitride layer is then removed from the bottom of the trench so that the silicon substrate exposed at the bottom of the trench can be thermally oxidized to form silicon oxide which fills the trench. As with the trench isolation methods, SWAMI suffers from stress-induced defects caused, in part, by the formation of a trench and oxidation of the substrate in an area in which the growth of the oxide is confined by the nitride layer. SWAMI technology is discussed in "Electrical Properties for MOS LSI's Fabricated Using Stacked Oxide SWAMI Technology," Sawada, et al., IEEE Transactions on Electron Devices, Vol. ED-32, No. 11, p. 2243, November, 1985.

In conventional isolation techniques, the oxidation process used to form the field oxide regions is a wet oxygen oxidation. Wet oxidation at temperatures greater than 1,000° C. causes a problem known as Kooi ribbons or white ribbons. The Kooi ribbon problem is discussed in "Formation of Silicon Nitride at a Si-SiO$_2$ Interface during Local Oxidation of Silicon and during Heat-Treatment of Oxidized Silicon in NH$_3$ Gas", Kooi, et al., J. Electrochem. Soc.: Solid-State Science and Technology, Volume 23, No. 7, p. 1117, July, 1976. This problem has been avoided by using oxidation temperatures of less than 1,000° C. and by the use of a sacrificial oxide which is removed prior to the formation of the gate oxide.

Another factor which limits the temperature used in the field oxidation is the lateral diffusion of field implant dopants into the active region during the field oxidation. Conventionally, the field implant is performed prior to the field oxidation. Thus, if the field oxidation temperature is too high, i.e., above approximately 1,000° C., the field oxidation will also drive the field implant causing a problem known as field implant encroachment. Field implant encroachment causes "narrow width effects" which degrade the performance of narrow transistors.

SUMMARY OF THE INVENTION

It is, therefore, an object of the present invention to provide a process for forming field oxide regions which may be used to fabricate active regions having small dimensions.

A further object of the present invention is to provide a process for forming field oxide regions which minimizes the size of the bird's beaks formed during the field oxidation.

Another object of the present invention is to provide a process for forming field oxide regions which eliminates or minimizes the creation of stress-induced defects during the formation of the field oxide regions.

Another object of the present invention is to provide a process for forming field oxide regions which allows the use of a higher nitride to oxide thickness ratio without inducing physical stresses sufficient to cause damage.

Another object of the present invention is to provide a process for forming field oxide regions which eliminates or reduces the formation of Kooi ribbons.

Another object of the present invention is to provide a process for forming field oxide regions in which the field oxidation can be performed at temperatures greater than 1,000° C.

Another object of the present invention is to provide a process for forming a field effect transistor which controls punch-through.

These and other objects of the present invention are accomplished by a process for forming field oxide regions which oxidizes the substrate in a dry oxygen environment at a temperature greater than or equal to 1,000° C. HCl is added to the oxidation environment to reduce or eliminate stacking faults. The higher temperature oxidation reduces physical stresses since the reduced viscosity of the field oxide being formed permits the oxide to flow. The reduction in physical stresses allow a higher nitride to oxide thickness ratio to be utilized, particularly nitride to oxide thickness ratios of approximately 10 and greater. A further benefit of the present invention is that the oxidation temperature can be selected to correspond to the temperature necessary to drive the well implant, thereby allowing the oxidation and well implant drive to take place concurrently. In addition, vertical scaling allows the field implant to be performed after the field oxide regions are formed. The field oxide regions are thin enough to allow the implant to pass through the field oxide regions. Performing a field implant which also introduces dopant ions into the active region of N-channel devices provides punch-through control.

A method of isolating active regions of a semiconductor substrate in accordance with the present invention, comprises the steps of (a) providing a barrier layer overlying the substrate, (b) providing a non-oxidizable masking layer overlying portions of the barrier oxide layer corresponding to active regions of the substrate, and (c) oxidizing the substrate in a dry oxygen environment at a temperature equal to or greater than 1,000° C. after step (b).

BRIEF DESCRIPTION OF THE DRAWINGS

FIGS. 3A, 3B, 4A, 4B and 5-7 are partial, sectional views useful in describing a process, in accordance with the present invention, of forming field oxide regions; and, FIGS. 8 and 9 are graphs which show the relationship of various parameters for processes in accordance with the present invention.

DESCRIPTION OF THE PREFERRED EMBODIMENTS

Figure 1:
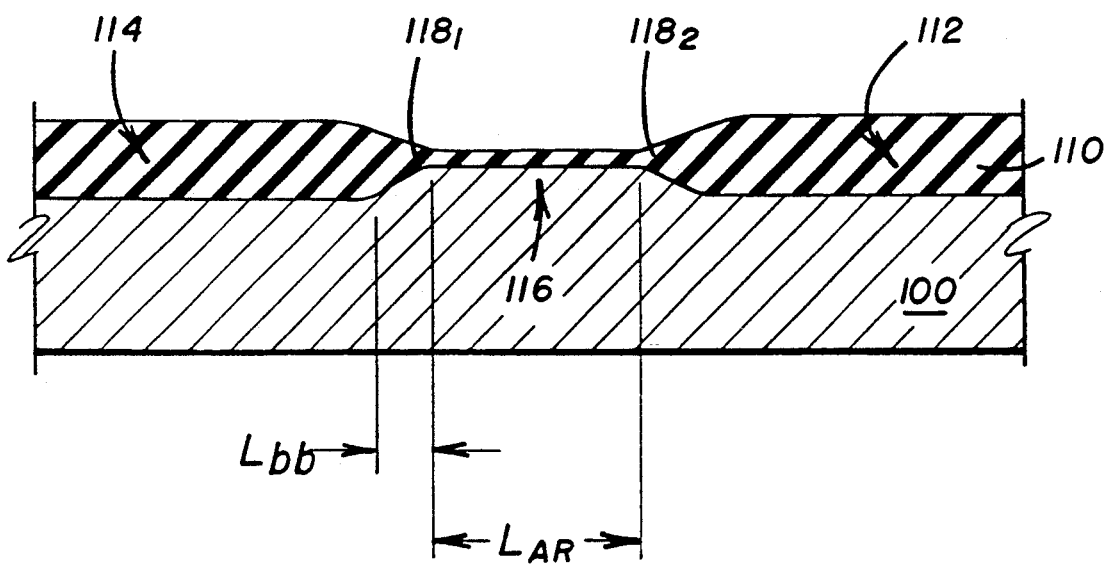
FIG. 1 is a partial, sectional view of a substrate having field oxide regions formed by a conventional LOCOS process.

A process for fabricating field oxide regions in accordance with the present invention will be described with reference to FIGS. 3-9. A comparison of structure formed utilizing the process of the present invention and the structure formed by a conventional LOCOS process is presented with reference to FIGS. 1 and 2. The process of the present invention is discussed in the context of the fabrication of an MOS field effect transistor (FET). However, a process in accordance with the present invention could be fashioned for use in the fabrication of other types of semiconductor devices, including bipolar devices. In the following discussion, references to N-type and/or P-type dopants are made as examples since the process of the present invention is equally applicable to N-channel and P-channel devices, and to processes utilized to form CMOS devices. Thus, references to a single dopant type are for convenience only, and, in some oases, the dopant type will be noted as N/P to indicate that either dopant type may be used.

Figure 3A:
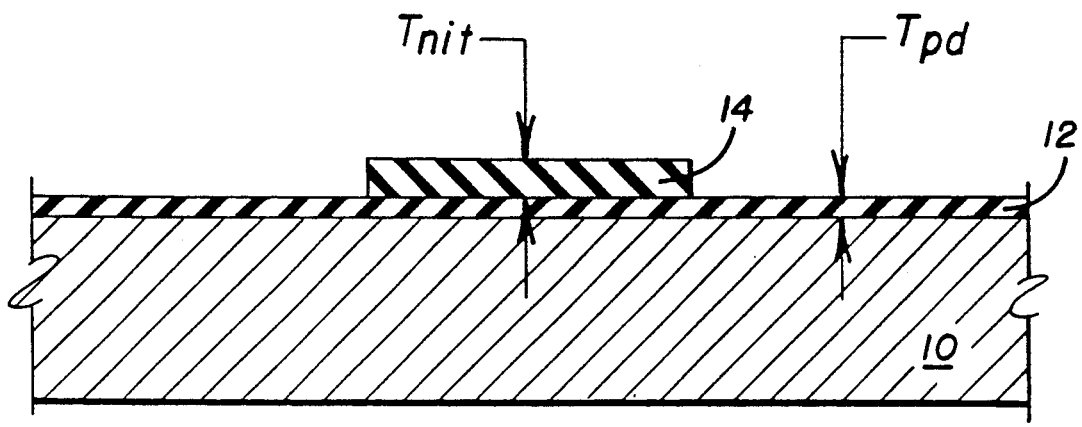
Figure 3B:
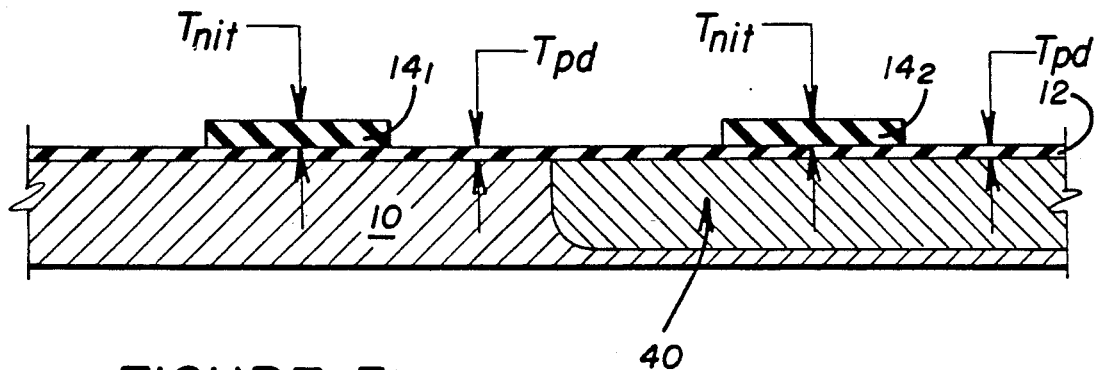

With reference to FIG. 3B, a substrate 10 having a background P-- doping concentration is masked so that an N-type dopant may be implanted in selected portions of the substrate to form N-wells 11. As shown in FIGS. 3A and 3B, a barrier layer 12 is formed at the surface of substrate 10. Barrier layer 12 may be an oxide layer formed by thermally oxidizing substrate 10. Alternatively, barrier layer 12 may be formed by depositing an oxide layer or another material which provides a barrier between the substrate and a subsequently formed layer overlying the barrier layer. Barrier layer 12 should be formed of a material which can be removed from the substrate and which does not damage the substrate.

A non-oxidizable masking layer 14 is then provided on barrier oxide layer 12. In one embodiment, the masking layer 14 is a nitride layer deposited using, for example, conventional chemical vapor deposition (CVD) techniques. Masking layer 14 is non-oxidizable so that the portions of substrate 10 underlying masking layer 14 are protected from oxidation during the formation of the field oxide regions, as discussed below. Nitride layer 14 is patterned and etched so that nitride regions 14 overlie only the portions of substrate 10 which are to be active regions. FIG. 3B corresponds to FIG. 3A, and shows two areas of the structure being formed, one with an N-well 11 and one without.

Barrier oxide layer 12 has a thickness $T_{pd}$ and nitride layer 14 has a thickness $T_{nit}$. The barrier oxide 12 thickness $T_{pd}$ may range from 50 to 250Å and the nitride 14 thickness $T_{nit}$ may range from 1,000 to 3,000Å. In one embodiment $T_{pd}$ is approximately 150Å and $T_{nit}$ is approximately 2,000Å. Thus, the ratio $T_{nit}/T_{pd}$ is approximately 13.

Figure 4A:
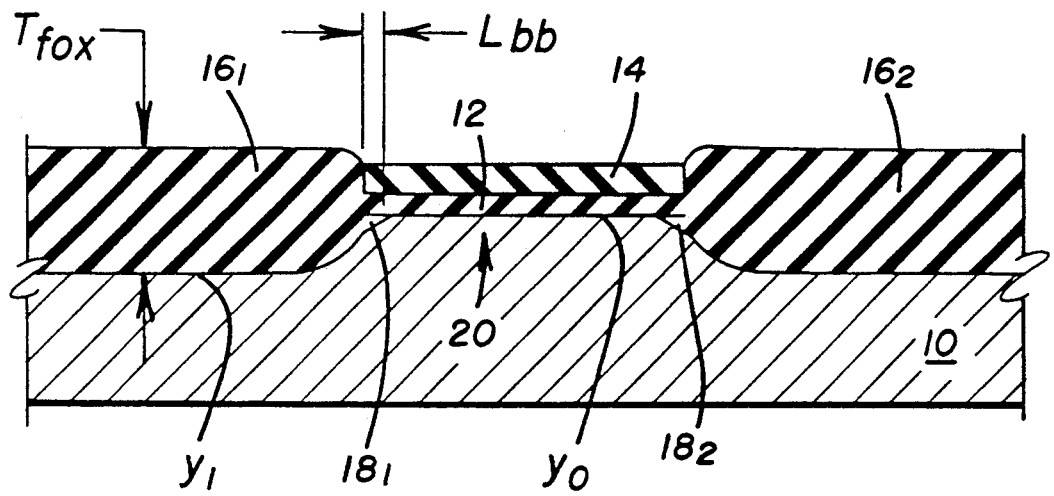

Field oxide regions $16_{1-2}$ (as shown in FIGS. 4A and B) are formed by oxidizing substrate 10 in an environment including dry oxygen and HCl at a temperature ranging from 1,000° to 1,250° C. The temperature of the dry oxidation may be selected so that the combination of the oxidation temperature and the time that the substrate is in the oxidation environment are appropriate to drive the well dopants implanted prior to the formation of field oxide regions 16.

In one embodiment of the invention, the dry oxidation is a multi-step oxidation process, in which a first oxidation step is performed at a temperature of approximately 1,000° C. in an atmosphere comprising approximately 0.1-10% HCl and 90-99.9% $O_2$ for a period of approximately 30 to 120 minutes. This first oxidation step forms a thin oxide layer over nitride 14 to protect the nitride from reacting with HCl during the later oxidation steps. The reaction of nitride 14 with HCl is dependent on temperature and does not occur below approximately 1,050° C. The purpose of adding HCl to the oxidizing atmosphere for the first oxidation step is to clean the surface to be oxidized by removing, for example, metallic contamination.

A second oxidation step is performed at a temperature of approximately 1,125° C. in an atmosphere comprising approximately 0.1-10% HCl and 90-99.9% $O_2$ for a period of approximately 4 to 10 hours. In this embodiment the oxidation time is 6.5 hours and field oxide regions $16_{1-2}$ have a thickness $T_{fox}$ of approximately 4,500Å. As in the first oxidation step the concentrations of HCl and $O_2$ in the oxidizing environment may be optimized by those of ordinary skill in the art. HCl is added to the oxidizing environment in the second oxidation step to prevent stacking faults. It is believed that $O_2$ is injected into the crystalline lattice of silicon substrate 10, and that this intersticial $O_2$ causes mismatches in the lattice which lead to stacking faults. The HCl neutralizes the interstitial $O_2$, thereby preventing stacking faults.

Both oxidation steps include a stabilization period in an inert or oxidizing atmosphere. In the multi-step oxidation embodiment of the invention the atmosphere for the stabilization period of the first oxidation step comprises 10-40% $O_2$ and 60-90% Argon and the atmosphere for the stabilization period of the second oxidation step comprises approximately 100% Argon. Those of ordinary skill in the art will be able to optimize the atmosphere during the stabilization period.

Figure 5:
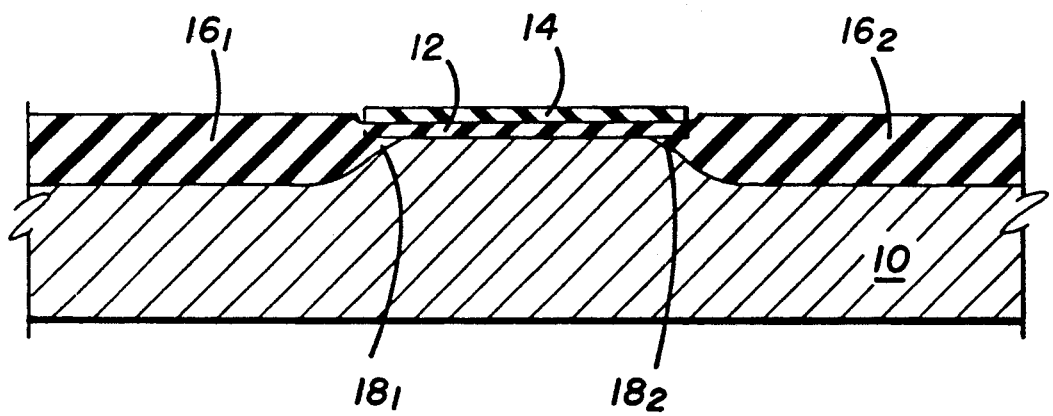
Figure 4B:
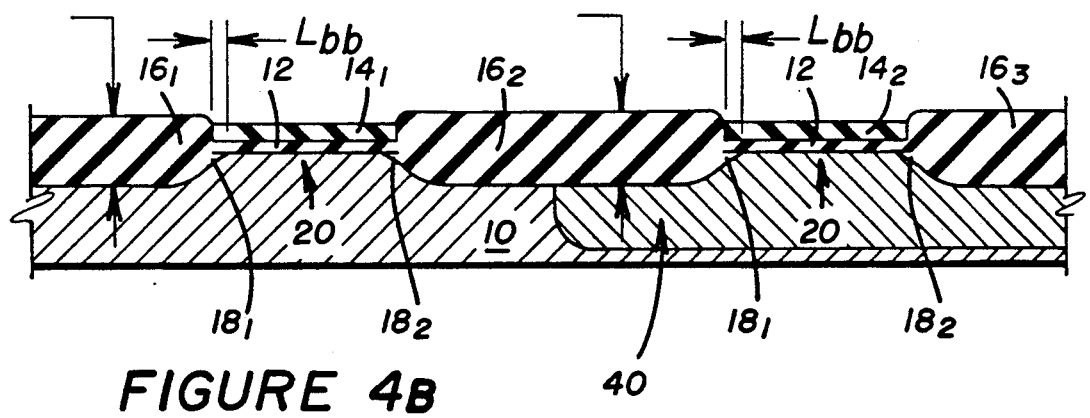

As shown in FIGS. 4 and 5, the bird's beak $18_{1-2}$ are relative small and do not impinge on the active region 20. In particular, the ratio $L_{bb}/T_{fox}$ is less than or equal to approximately 0.3 for $T_{fox}$ of 4,500Å. This ratio is less than ⅓ of the ratio provided by conventional LOCOS processes.

At this point in the process, two alternate process flows may be followed. In the first alternative process flow, nitride layer 14 is removed using a conventional hot phosphoric wet etch. In the second alternative process flow, before the nitride layer 14 is removed, a plasma etch or a wet etch is performed to remove approximately 500-1,500Å of the field oxide regions $16_{1-2}$ and nitride layer 14, as shown in FIG. 5. This etching step reduces the step height of field oxide region $16_{1-2}$, and thus improves planarization of the semiconductor devices which are formed.

After nitride layer 14 is removed, a sacrificial oxide may be grown. The use of a sacrificial oxide is optional. Then, a field implant is performed to enhance the isolation for N-channel devices. The field implant introduces dopant ions into the active regions and the areas underlying the field oxide regions. Conventionally, the field implant is performed before the field oxide formation, requiring the field oxidation temperature to be lowered in order to prevent lateral diffusion of the field implant dopant. During the field implant the N well regions are masked, and the P-type dopant forms P-wells 22 (shown in FIG. 6) having a P- dopant concentration. Further, P- regions $24_{1-2}$ are formed under field oxide regions $16_{1-2}$, respectively. Regions $24_{1-2}$ are used to enhance isolation for N-channel devices. Providing a P- well 22 is desirable for punch-through control for submicron devices, particularly when a P-- substrate 10 is utilized. After the field implant is completed the sacrificial oxide is removed and a gate oxide is grown.

Figure 2:
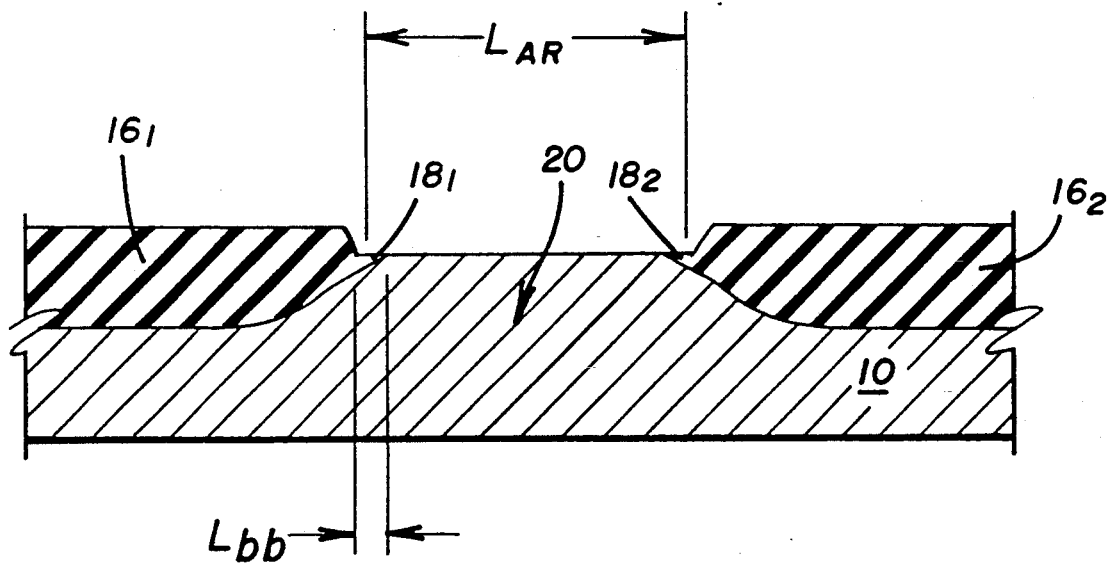
FIG. 2 is a partial, sectional view of a substrate having field oxide regions formed in accordance with the present invention.

The differences in the structures for by conventional LOCOS techniques and the present invention are compared in FIGS. and 2. The length of the bird's beaks $18_1$ and $18_2$ formed by the subject method and shown in FIG. 2 is much shorter than the length of the conventional bird's beaks 118, and 1182 in FIG. 1 the comparison of FIGS. and 2 are based on photographs made using a scanning electron microscope.

As shown in FIG. 7, a field effect transistor, including source and drain regions 32, 34, is fabricated in an active region in well 22 in accordance with conventional techniques. Source and drain regions 32, 34 are spaced apart to define a channel region 36 therebetween so that channel region 36 underlies gate structure 30 which includes a gate oxide and a gate. Conventional techniques may then be used to form passivation layers, and conductive interconnect layers formed of, for example, polysilicon or metal.

The inventors have developed a theoretical model for determining the conditions and parameters which will yield a selected ratio of $L_{bb}/T_{fox}$. The theoretical model uses the following variables, with all thicknesses expressed in microns (μm):

| | |
|---|---|
| R (y, t) | oxidation rate at Si/SiO$_2$ interface at a position under nitride layer 14 (position y$_0$ (FIG. 4A)); |
| R$_o$ (t) | oxidation rate at Si/SiO$_2$ interface at a position under field oxide 16 (position y$_1$ (FIG. 4A)); |
| Ks | surface rate of oxidation; |
| T | oxidation temperature; |
| D | diffusitivity of the oxidant in SiO$_2$; and |
| r | decay coefficient. |

To determine $L_{bb}$ as a function of $T_{pd}$ and T for constant $T_{fox}$ and $T_{nit}$ the following relationships apply, where the values $C_x$ are constants:

$$r = C_0[Ks/(T_{pd})(D)]^{\frac{1}{2}} \quad (1)$$

$$Ks/D = C_1 e^{C_2/kT} \quad (2)$$

$$R(y,t)/R_o(t) = C_3 e^{-ry} \quad (3)$$

Applying the boundary conditions
$R/R_o = 0.1$ for $y = 0$ and
$R/R_o = 0.9$ for $y = L_{bb}$
and solving for $L_{bb}$ yields, $$L_{bb} = C_4(r)^{-1} \quad (4)$$

Substituting for r in Equation (4), $$L_{bb} = C_5(T_{pd})^{\frac{1}{2}} e^{C_2/kT} \quad (5)$$

To determine $L_{bb}/T_{fox}$ as a function of $T_{fox}$ for constant $T_{pd}$ and $T_{nit}$, $$L_{bb}/T_{fox} = C_6(T_{fox})^{-\frac{1}{2}} \quad (6)$$

To determine $L_{bb}/T_{fox}$ as a function of $T_{fox}$ for constant $T_{pd}$ and $T_{nit}$, $$L_{bb}/T_{fox} = C_7(T_{pd})^{\frac{1}{2}}(T_{nit})^{-\frac{1}{2}} \quad (7)$$

To calculate the narrow window effects on field oxide thickness the following new variables are introduced:

W width of nitride window; and
Dy lateral diffusion coefficient.

$$T_{fox}(W,t) = T_0(t)\{2erf[W(Dy - t)^{-\frac{1}{2}}/4]\}^{\frac{1}{2}}, \quad (8)$$

where $$Dy = \frac{6.81 \times 10^{-4}(T_{pd} + 143)}{(T_{nit} + 584) - 1.14 \times 10^{-4}}$$

Note that there is no decrease in $L_{bb}$ for decreasing nitride window W, even for a thinner field oxide $T_{fox}$.

Combining Equations (5), (6), and (7) and solving for the constants by fitting to experimental data, the resulting equation for the ratio $L_{bb}/T_{fox}$ is $$L_{bb}/T_{fox} = C_8[T_{pd}]^{\frac{1}{2}}[T_{nit}]^{-\frac{1}{2}}[T_{fox}]^{-\frac{1}{2}}e^{0.34/kT} \quad (9)$$

where $C_8$ is a curve fitting constant ranging from 0.4–0.7 um$^{\frac{1}{2}}$.

The desired ratio of $L_{bb}/T_{fox}$ was selected to be 0.3, based on $L_{bb} = 0.14$ microns and $T_{fox} = 0.45$ microns. Table 1 lists various combinations of $T_{pd}$, $T_{nit}$, and T which yield a ratio of 0.3.

TABLE 1

| $T_{pd}$ (Å) | $T_{nit}$ (Å) | T (°C.) |
|---|---|---|
| 15 | 1350 | 950 |
| 25 | 1350 | 1000 |
| 30 | 1350 | 1050 |
| 45 | 2000 | 1050 |
| 100 | 8211 | 950 |
| 100 | 6373 | 1000 |
| 100 | 5046 | 1050 |
| 150 | 2000 | 1125 |

Figure 8:
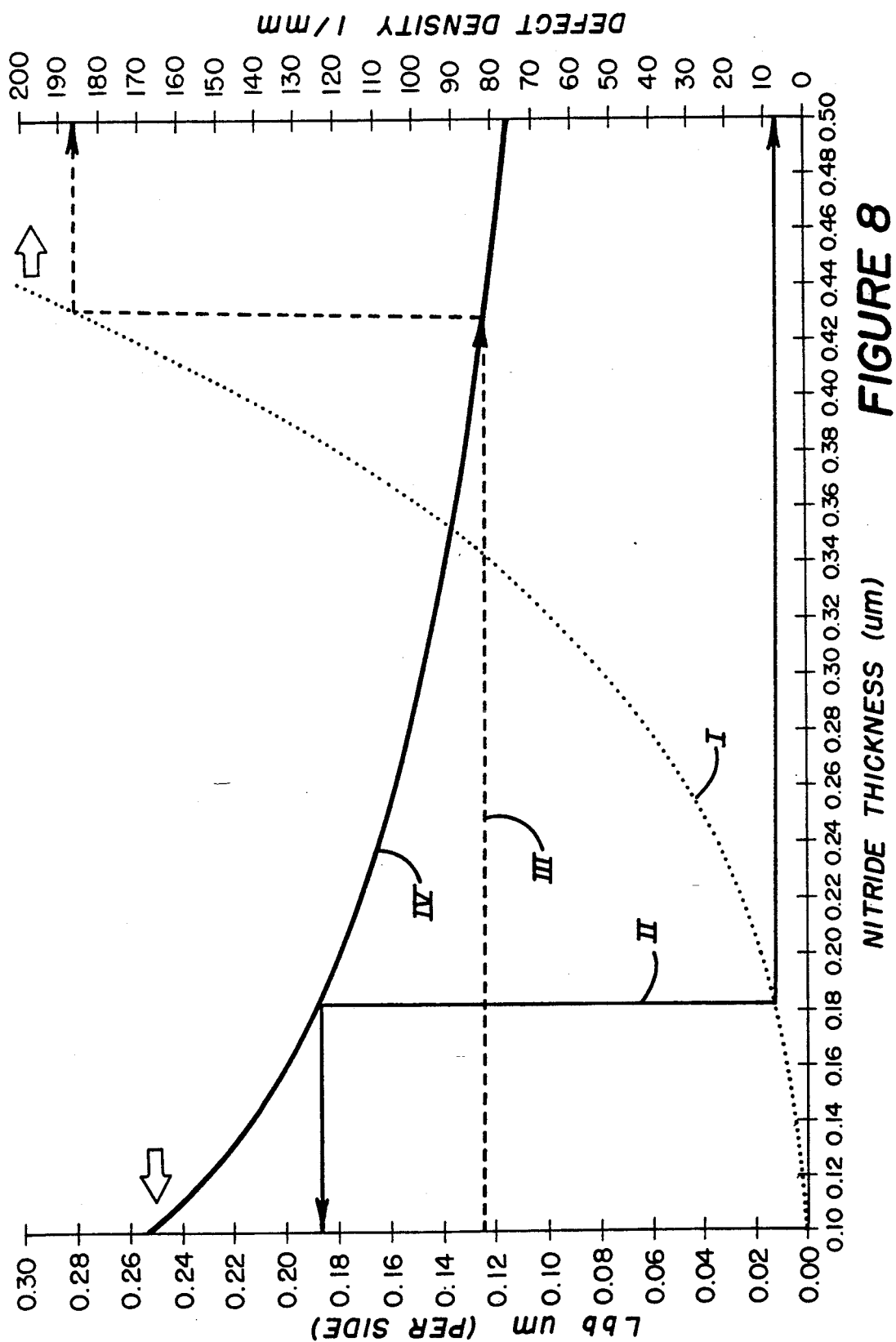
Figure 9:
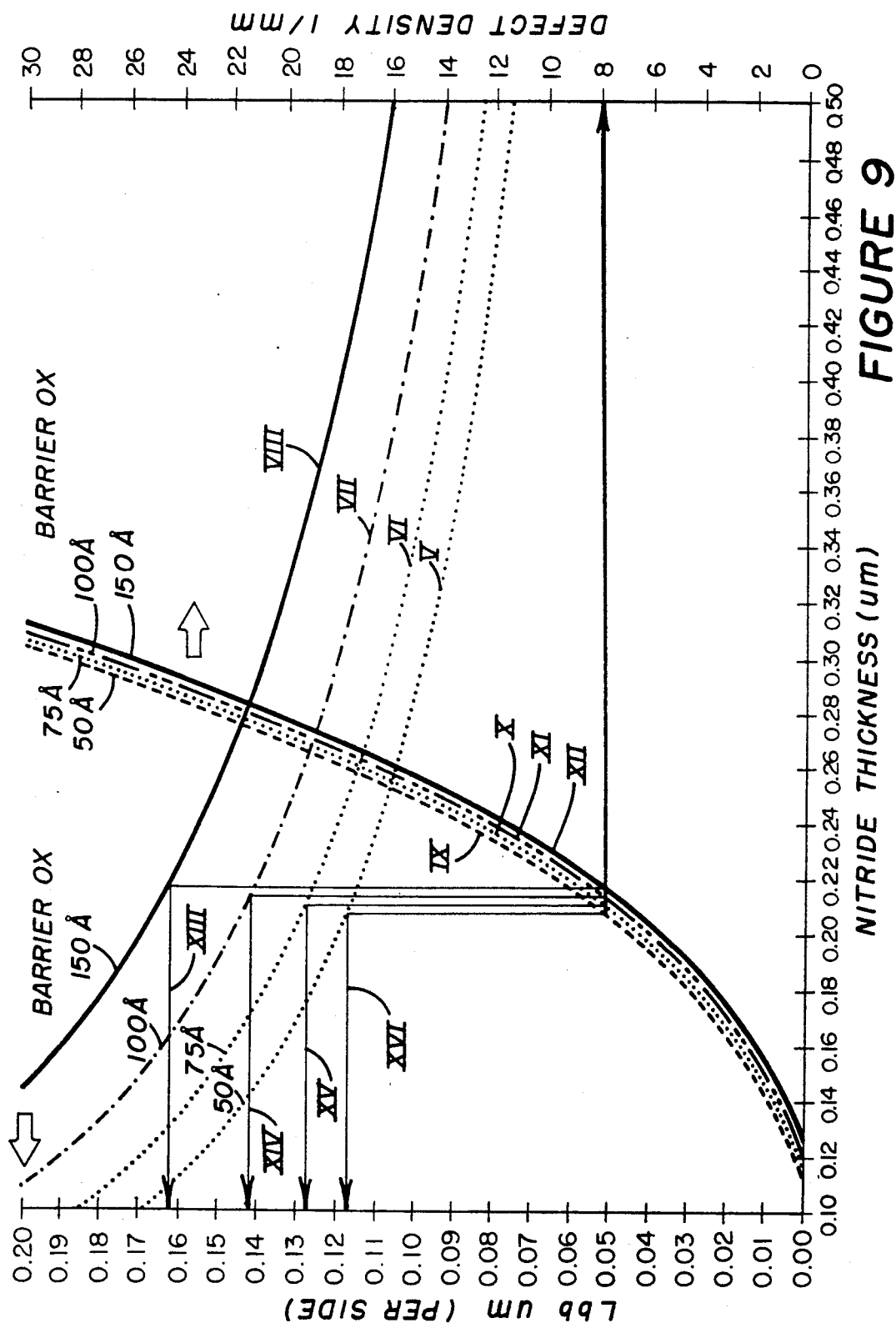

FIGS. 8 and 9 are useful for expressing the theoretical model. In FIG. 8 curve I is the theoretical relationship between nitride thickness and defect density and curve IV is the theoretical relationship between $L_{bb}$ and nitride thickness for a field oxide thickness of 4,000Å. Curve II shows $L_{bb}$ and the defect density for devices fabricated using conventional LOCOS process with a 50Å barrier oxide, and indicates that conventional LOCOS processes cannot provide an $L_{bb}/T_{fox}$ ratio of 0.3. If convention LOCOS process were used to achieve an $L_{bb}/T_{fox}$ ration of 0.3, curve III shows that the defect density would be far beyond acceptable limits.

In FIG. 9 curves V–VIII are the theoretical relationships between $L_{bb}$ and nitride thickness for the process of the present invention for barrier oxide thickness of 50, 75, 100 and 150Å, respectively, for a field oxide thickness of 5,000Å. Curves IX–XII are the theoretical relationships between nitride thickness and defect density for the process of the present invention and the save barrier oxide thicknesses, respectively. Curves XIII–XVI show that for a defect density similar to that achieved by conventional LOCOS processes, $L_{bb}$ for the present invention is reduced. In particular, for the present invention a barrier oxide of 150Å provides an $L_{bb}$ of 0.1625 microns for a field oxide thickness of 5,000Å, which is less than $L_{bb}$ of 0.19 microns provided by a 50Å barrier oxide and conventional LOCOS processing producing a 4,000Å field oxide. Using the present invention, $L_{bb}$ is 0.118 microns for a 50Å barrier oxide and a 5,000Å field oxide, and $L_{bb}$ is 0.07 microns for a 50Å barrier oxide and a 4,000Å field oxide, an improvement of approximately 50% over conventional LOCOS process as shown in FIG. 8.

Experimental results show that the theoretical model is conservative and experimental results have provided better results than those indicated by the model. For a barrier oxide of 150Å and a nitride thickness of 2,000Å, $L_{bb}$ has been measured as less than 0.15 microns for a 4,500Å field oxide layer.

Using the process of the present invention, it is possible to fabricate semiconductor devices having geometries, including channel lengths, as small as 0.3 microns.

The disclosed embodiments of the present invention are intended to be illustrative and not restrictive, and the scope of the invention is find by the following claims rather than by the foregoing description.

We claim:

1. A method of forming field oxide regions in a semiconductor substrate, comprising the steps of:
   (a) providing a barrier oxide layer overlying the substrate;
   (b) providing a non-oxidizable masking layer overlying portions of the barrier oxide layer corresponding to active regions;
   (c) oxidizing the substrate in a dry oxygen environment at a temperature less than 1,050° C. after said step (b); and
   (d) oxidizing the substrate in a dry oxygen environment including HCl at a temperature greater than 1,050° C. after said step (c).

2. A method according to claim 1, wherein:
   said step (a) comprises providing a barrier oxide layer having a thickness x;
   said step (b) comprises providing a masking layer having a thickness y; and
   the ratio y/x is equal to or greater than 5.

3. A method according to claim 1, wherein:
   said step (a) comprises providing a barrier oxide layer having a thickness x, where x is greater than approximately 50Å;
   said step (b) comprises providing a masking layer having a thickness y, where y is greater than approximately 1,000Å; and
   the ratio y/x is equal to or greater than 10.

4. A method according to claim 1, wherein said step (d) comprises oxidizing the substrate at a temperature ranging from approximately 1,100° C. to approximately 1,250° C.

5. A method according to claim 1, further comprising the step (e) of performing a field implant after said step (d).

6. A method according to claim 1, further comprising the step of (e) implanting a dopant having a conductivity type opposite to the conductivity type of the substrate in a portion of the substrate prior to said step (c), wherein said steps (c) and (d) comprise driving the dopant implanted in said step (e) and concurrently oxidizing the substrate.

7. A method according to claim 1, wherein: said step (c) comprises oxidizing the substrate in a dry oxygen environment including HCl; and said step (d) comprises oxidizing the substrate at a temperature greater than approximately 1,100° C.

8. An improved method of forming field oxide regions in a substrate includes the steps of providing an oxide layer overlying the substrate, providing a nitride layer overlying portions of the barrier layer corresponding to selected first regions of the substrate, and oxidizing second regions of the substrate to forms field oxide regions, the improvement comprising the steps of:
   (a) oxidizing the substrate in a dry oxygen environment including HCl at a temperature less than 1,050° C.; and
   (b) oxidizing the substrate in a dry oxygen environment comprising $O_2$ and including HCl at a temperature greater than approximately 1,100° C., after said step (a), said steps (a) and (b) being performed prior to a field implant.

9. A method according to claim 8, wherein the improvement further comprises the step of:
   (c) implanting a well dopant in a selected portion of the substrate prior to said step (a), wherein said steps (a) and (b) comprise concurrently oxidizing the substrate and driving the well dopant implanted in said step (c).

10. A method of forming field oxide FOX, regions in a semiconductor substrate, comprising the steps of:
    (a) implanting a well dopant in a selected well region of the substrate;
    (b) providing a barrier oxide layer overlying the substrate;
    (c) providing a nitride layer overlying portions of the barrier oxide corresponding to active regions of the substrate;
    (d) forming FOX regions and driving the well dopant implanted in said step (a) by (i) oxidizing the substrate in a dry oxygen environment at a temperature less than 1,050° C. after said step (c) and (ii) oxidizing the substrate in a dry oxygen environment including HCl at a temperature greater than 1,050° C. after said step (d)(i); and
    (e) of performing a field implant after said step (d).

11. A method according to claim 10, wherein:
    said step (b) comprises providing a barrier oxide layer having a thickness x;
    said step (c) comprises providing a nitride layer having a thickness y; and
    the ratio y/x is equal to or greater than 10.

12. A method according to claim 10, wherein:
    said step (b) comprises providing a barrier oxide layer having a thickness x, where x is approximately 50-250Å;
    said step (c) comprises providing a nitride layer having a thickness y, where y is approximately 1,000-3,000Å; and
    the ratio y/x is equal to or greater than 10.

13. A method of fabricating a plurality of field effect transistors in a semiconductor substrate having a conductivity type, the field effect transistors being electrically isolated by field oxide regions, comprising the sequential steps of:
    (a) implanting a dopant of the opposite conductivity type to form at least one well in the substrate;
    (b) providing a barrier oxide layer overlying the substrate;
    (c) providing a nitride layer overlying portions of the barrier oxide corresponding to active regions of the substrate, at least one active region being located in the well;
    (d) oxidizing the substrate in an environment comprising $O_2$ and HCl at a temperature less than approximately 1,050° C. and then oxidizing the substrate in an environment comprising $O_2$ and HCl at a temperature greater than approximately 1,100° C. to form field oxide regions and to drive the dopant implanted in said step (a);
    (e) removing the nitride layer;
    (f) implanting a field dopant in the substrate, said implant being performed through the field oxide regions;
    (g) providing a plurality of gates overlying respective ones of the active regions of the substrate; and
    (h) implanting source and drain regions in each of the active regions utilizing the corresponding gates as masks so that each pair of source and drain regions are spaced apart and define a channel region therebetween.

14. A method according to claim 13, further comprising the step of:

(i) etching the nitride and the field oxide regions to reduce the step height of the field oxide after said step (d) and before said step (e).

15. A method according to claim 13, further comprising the step of:
(i) etching the nitride and the field oxide regions with a plasma etchant, including $CF_4$, which etches the nitride and the field oxide at approximately the same rate to reduce the step height of the field oxide after said step (d) and before said step (e).

16. A method according to claim 13, wherein:
said step (b) comprises providing a barrier oxide layer having a thickness x;
said step (c) comprises providing a nitride layer having a thickness y; and
the ratio y/x is equal to or greater than 10.

17. A method according to claim 13, wherein:
said step (b) comprises providing a barrier oxide layer having a thickness x, where x is approximately 50–250Å;
said step (c) comprises providing a nitride layer having a thickness y, where y is approximately 1,000–3,000Å; and
the ratio y/x is equal to or greater than 10.

18. A method according to claim 13, wherein said step (f) comprises implanting a field dopant in active regions defined by the field oxide regions formed in said step (d).

19. A method of forming field oxide regions in a substrate, the method comprising the steps of:
providing a barrier oxide layer overlying the substrate, the barrier oxide layer having a thickness x;
providing a nitride layer overlying portions of the barrier oxide layer corresponding to selected first regions of the substrate, the nitride layer having a thickness y, wherein the ratio y/x is equal to or greater than approximately 10;
first oxidizing second regions of the substrate to forms field oxide regions;
first oxidizing the substrate in a dry oxygen environment at a temperature less than approximately 1,050° C.; and
second oxidizing the substrate in a dry oxygen environment including $O_2$ and HCl at a temperature less than approximately 1,050° C.; wherein
said first and second oxidizing steps are performed prior to any subsequent field implantation step.

20. A method according to claim 19 wherein: said second oxidizing step comprises oxidizing at a temperature greater than approximately 1,100° C.

* * * * *

UNITED STATES PATENT AND TRADEMARK OFFICE
CERTIFICATE OF CORRECTION

PATENT NO. : 5,151,381
DATED : September 29, 1992
INVENTOR(S) : Liu et al.

It is certified that error appears in the above-identified patent and that said Letters Patent is hereby corrected as shown below:

Title page, item 75: change "Jih-Chang Lein" to --Jih-Chang Lien--.

Claim 9, line 2, change "of;" to -- of:--.

Claim 10, line 1, add--,-- following "oxide".

Signed and Sealed this

Eighth Day of June, 1993

Attest:

MICHAEL K. KIRK

*Attesting Officer*  Acting Commissioner of Patents and Trademarks